(12) United States Patent
Su (10) Patent No.: US 10,180,744 B2
(45) Date of Patent: Jan. 15, 2019

(54) FLEXIBLE EMBEDDED TOUCH CONTROL STRUCTURE AND MANUFACTURING METHOD THEREOF

(71) Applicant: Wuhan China Star Optoelectronics Technology Co., Ltd., Wuhan (CN)

(72) Inventor: Weisheng Su, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/571,037

(22) PCT Filed: Apr. 17, 2017

(86) PCT No.: PCT/CN2017/080736
§ 371 (c)(1),
(2) Date: Oct. 31, 2017

(87) PCT Pub. No.: WO2018/166028
PCT Pub. Date: Sep. 20, 2018

(65) Prior Publication Data
US 2018/0348926 A1    Dec. 6, 2018

(30) Foreign Application Priority Data

Mar. 14, 2017    (CN) .......................... 2017 1 0151467

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/044* (2013.01); *H01L 27/323* (2013.01);
(Continued)

(58) Field of Classification Search
CPC combination set(s) only.
See application file for complete search history.

(56) References Cited

U.S. PATENT DOCUMENTS 8,368,661 B2 * 2/2013 Chang ..................... G06F 3/044
345/173
8,674,954 B2 * 3/2014 Kwon ................... H01L 27/323
345/173
(Continued)

FOREIGN PATENT DOCUMENTS

CN    103677431 A    3/2014
CN    103887324 A    6/2014
(Continued)

*Primary Examiner* — Koosha Sharifi-Tafreshi
(74) *Attorney, Agent, or Firm* — Leong C. Lei (57) ABSTRACT

The present invention provides a flexible embedded touch control structure and a manufacturing method thereof. The flexible embedded touch control structure of the present invention includes a TFT substrate, a planarization layer, an OLED touch layer, and an encapsulation layer. The OLED touch layer includes an anode layer, a pixel definition layer, emissive layers, and a cathode layer. The anode layer includes a plurality of anode units and a plurality of touch connection line. The plurality of touch connection lines are located under and correspond to the pixel definition layer. The cathode layer includes a plurality of touch electrodes, and the plurality of touch electrodes are respectively connected through a plurality of vias formed in the pixel definition layer to the touch connection lines to form a touch sensing structure. The present invention integrates a touch sensor in a flexible panel so as to effectively reduce the number of attaching operations conducted in a panel, reduces an overall thickness of the panel, increases the flexibility of the panel, and thus improve yield, and compared to an existing flexible OLED panel, requires only (Continued)

change of the pattern designs of the cathode layer and the anode layer so that the manufacturing process is simple.

11 Claims, 6 Drawing Sheets

(51) Int. Cl.
    *H01L 51/00*         (2006.01)
    *H01L 51/52*         (2006.01)
    *H01L 51/56*         (2006.01)
    *G06F 3/044*        (2006.01)

(52) U.S. Cl.
    CPC ...... *H01L 27/3246* (2013.01); *H01L 27/3258* (2013.01); *H01L 51/0011* (2013.01); *H01L 51/0023* (2013.01); *H01L 51/0097* (2013.01); *H01L 51/5228* (2013.01); *H01L 51/5237* (2013.01); *H01L 51/56* (2013.01); *G06F 2203/04102* (2013.01); *G06F 2203/04103* (2013.01); *G06F 2203/04111* (2013.01); *H01L 2227/323* (2013.01); *H01L 2251/5338* (2013.01)

(56) References Cited

U.S. PATENT DOCUMENTS

| | | | |
|---|---|---|---|
| 9,299,750 B2* | 3/2016 | Lim | ........................ H01L 27/323 |
| 9,880,681 B2* | 1/2018 | Kang | ........................ G06F 3/044 |
| 2014/0210767 A1* | 7/2014 | Hur | ........................ G06F 3/0412 |
| | | | 345/174 |
| 2015/0185915 A1* | 7/2015 | Lim | ........................ G06F 3/044 |
| | | | 345/174 |

FOREIGN PATENT DOCUMENTS

| | | |
|---|---|---|
| CN | 104750321 A | 7/2015 |
| CN | 104850268 A | 8/2015 |
| CN | 106406590 A | 2/2017 |

* cited by examiner

FLEXIBLE EMBEDDED TOUCH CONTROL STRUCTURE AND MANUFACTURING METHOD THEREOF

BACKGROUND OF THE INVENTION

1. Field of the Invention

The present invention relates to the field of touch display technology, and more particular to a flexible embedded touch control structure and a manufacturing method thereof.

2. The Related Arts

The fast progress of the display technology brings popularization of touch screens to the daily living of human being. For example, with the touch screen, a user is allowed operate a program and input messages/texts/drawings on a screen with a finger or a touch stylus, saving the trouble of operating a keyboard or pushbuttons. Practically, a touch screen is generally made up of a sensing panel and a display arranged on the back of the sensing panel. Based on the location where a user touches the sensing panel and an image concurrently displayed by the display device, an electronic device may determine the "meaning" of the touch and execute the result of such an operation.

Figure 1:
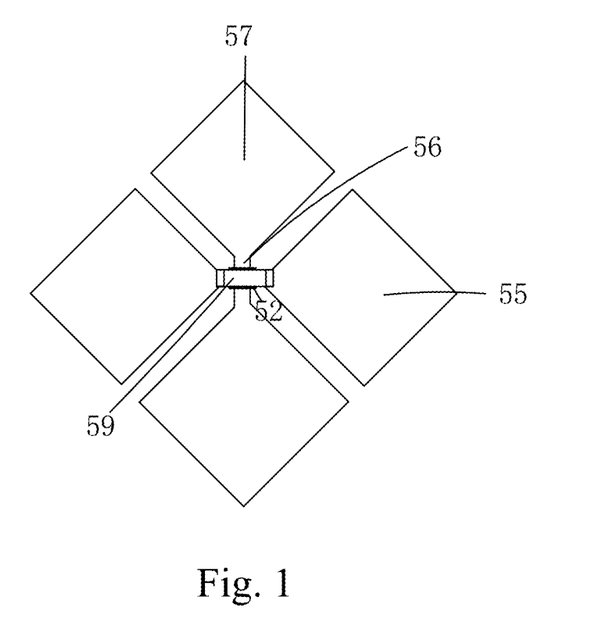
FIG. 1 is a schematic top plan view illustrating a conventional bridge capacitive touch control structure.

The most widely used capacitive touch techniques are mainly bridge capacitive touch technology and self capacitance touch technology. A self capacitance touch screen is realized with a single layer self capacitance touch electrode structure of which a manufacturing process is simple. In the self capacitance touch screens, the touch electrodes often adopt a block pattern design. To connect the touch electrodes and the touch detection chip, touch signal lines that correspond to and are connected with the touch electrodes are provided in order to transmit a touch signal to the touch detection chip. To reduce resistance variation among the touch electrodes and to ensure accuracy of touch control, virtual touch signal lines that correspond to and are connected with the touch electrodes are provided. For a bridge capacitive touch structure, there is only one transparent conductive layer that provide the touch control function. The touch electrodes are generally of a rhombus design. A standard bridge capacitive touch structure is shown in FIG. 1, in which structural elements, such as a substrate, are omitted to more clearly illustrate a bridging structure. A touch electrode layer is provided with multiple columns of first touch electrodes 27 in the form of rhombus and multiple rows of second touch electrodes 55 arranged between the first touch electrodes 57. Adjacent first touch electrodes 57 in each row of first touch electrode 57 are connected to each other by means of a first connection section 56 located on the same layer. To allow an electrical signal to transmit out, the second touch electrodes 55 of the same row must be connected in series. As such, a bridge 59 that extends over and across the first connection section 56 must be constructed to connect the adjacent second touch electrodes 55 and this provides a bridging structure. Further, to form capacitance at a bridging point of the bridging structure, an insulating dielectric must be provided, such as an insulation layer 52 shown in FIG. 1, to isolate the first connection section 56 and the bridge 59 from each other.

Figure 2:
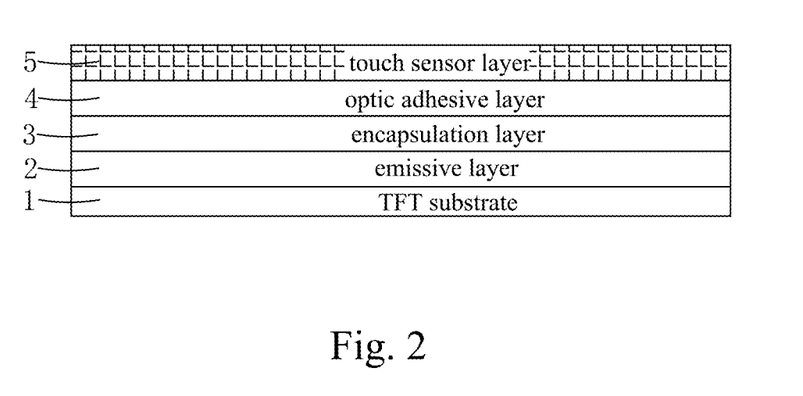
FIG. 2 is a schematic view illustrating a conventional flexible touch control structure.

Recently, flexible display devices began to emerge in the market. However, the flexible touch control products that are currently available have the following drawbacks: (1) having a fixed shape and being not allowed to bend as desired; (2) a touch sensor film being additionally required to provide the desired touch control function, this greatly increasing difficulty of manufacturing; and (3) an electrode material of a touch sensor being indium tin oxide (ITO), which suffers insufficiency of flexibility. As shown in FIG. 2, a schematic view is provided to illustrate a conventional flexible touch control structure, which comprises a flexible panel that generally comprises, stacked in sequence, a thin-film transistor (TFT) substrate 1, an emissive layer 2, and an encapsulation layer 3, an optic adhesive layer 4 disposed atop the encapsulation layer 3 of the flexible panel, and a touch sensor layer 5 attached to a top of the optic adhesive layer 4. In the known flexible touch control structure, the traditional full attachment technology requires a large amount of adhesive and peeling may occur after flexing for multiple times, leading to failure of the panel.

SUMMARY OF THE INVENTION

Objectives of the present invention are to provide a flexible embedded touch control structure, in which a touch sensor is integrated in a flexible panel so as to effectively reduce an overall thickness of the panel, improve flexibility of the panel, and make the manufacturing process easy.

Objectives of the present invention are also to provide a manufacturing method of a flexible embedded touch control structure, in which a touch sensor is integrated in a flexible panel so as to effectively reduce an overall thickness of the panel, improve flexibility of the panel, and make the manufacturing process easy.

To achieve the above objectives, the present invention provides a flexible embedded touch control structure, which comprises: a thin-film transistor (TFT) substrate, a planarization layer arranged on the TFT substrate, an organic light emitting diode (OLED) touch layer arranged on the TFT substrate and the planarization layer, and an encapsulation layer arranged on the OLED touch layer;

wherein the OLED touch layer comprises: an anode layer arranged on the TFT substrate, a pixel definition layer arranged on the planarization layer and the anode layer, emissive layers arranged on the anode layer, and a cathode layer arranged on the pixel definition layer and the emissive layers;

the pixel definition layer defines and surrounds a plurality of pixel openings that are arranged in an array on the anode layer; the anode layer comprises a plurality of anode units that are arranged to correspond to the pixel openings respectively and a plurality of touch connection lines located under the pixel definition layer and arranged alternate with the anode units; and the emissive layers are arranged in the pixel openings;

the pixel definition layer is formed with a plurality of vias located above the touch connection line; and the cathode layer comprises a plurality of touch electrodes, and the plurality of touch electrodes are respectively connected through the plurality of vias to the touch connection lines to form a touch sensing structure; and the cathode layer covers the plurality of pixel openings and the emissive layer arranged in each of the pixel openings, the one of the anode units located thereunder and corresponding thereto, and the cathode layer located thereabove and corresponding thereto collectively form an OLED unit structure.

Optionally, the touch sensing structure comprises a bridge capacitive touch sensing structure, wherein the plurality of touch electrodes comprise a plurality of first touch electrode sections arranged in an array, a plurality of second touch electrode sections located between the plurality of first touch electrode sections and arranged in an array, and a plurality of connection sections each electrically connecting two adjacent ones of the first touch electrode sections; and the touch connection lines function as bridges of the bridge capacitive touch sensing structure to each electrically connect two adjacent ones of the second touch electrode sections.

The plurality of touch electrodes cover a portion of the plurality of pixel openings; and the cathode layer further comprises a plurality of auxiliary electrodes located between the plurality of touch electrodes and the plurality of auxiliary electrodes cover a remaining portion of the plurality of pixel openings; and the first touch electrode sections and the second touch electrode sections are both rhombus in shape.

Optionally, the touch sensing structure comprises a self capacitance touch sensing structure, wherein the touch connection lines function as signal lines of the self capacitance touch sensing structure.

The plurality of touch electrodes are each a rectangle in shape and the plurality of touch electrodes cover the plurality of pixel openings.

The present invention also provides a manufacturing method of a flexible embedded touch control structure, comprising the following steps:

Step 1: providing a TFT substrate, forming an organic material film on the TFT substrate, and subjecting the organic material film to patterning treatment to form a planarization layer;

Step 2: forming a first conductive layer on the TFT substrate and the planarization layer through deposition and subjecting the first conductive layer to patterning treatment to form an anode layer, wherein the anode layer comprises a plurality of anode units that are spaced from each other and a plurality of touch connection lines arranged between the plurality of anode units;

Step 3: forming an isolation layer on the planarization layer and the anode layer and subjecting the isolation layer to patterning treatment to form a pixel definition layer, wherein the pixel definition layer defines and surrounds a plurality of pixel openings arranged in an array on the anode layer to respectively correspond to the plurality of anode units and the pixel definition layer is formed with a plurality of vias located above the touch connection lines;

Step 4: forming emissive layers in the pixel openings defined and surrounded by the pixel definition layer on the anode layer;

Step 5: providing a first fine mask and using the first fine mask as a shielding layer to form a patterned cathode layer on the pixel definition layer and the emissive layers through vapor deposition so as to form an OLED touch layer that comprises the anode layer, the pixel definition layer, the emissive layers, and the cathode layer;

wherein the cathode layer comprises a plurality of touch electrodes, and the plurality of touch electrodes are respectively connected through the plurality of vias to the touch connection lines to form a touch sensing structure, wherein the cathode layer covers the plurality of pixel openings and the emissive layer arranged in each of the pixel openings, the one of the anode units located thereunder and corresponding thereto, and the cathode layer located thereabove and corresponding thereto collectively form an OLED unit structure; and Step 6: forming an encapsulation layer on the pixel definition layer and the cathode layer.

Optionally, the touch sensing structure comprises a bridge capacitive touch sensing structure, wherein the plurality of touch electrodes comprise a plurality of first touch electrode sections arranged in an array, a plurality of second touch electrode sections located between the plurality of first touch electrode sections and arranged in an array, and a plurality of connection sections each electrically connecting two adjacent ones of the first touch electrode sections; and the touch connection lines function as bridges of the bridge capacitive touch sensing structure to each electrically connect two adjacent ones of the second touch electrode sections.

The plurality of touch electrodes cover a portion of the plurality of pixel openings; and the cathode layer further comprises a plurality of auxiliary electrodes located between the plurality of touch electrodes and the plurality of auxiliary electrodes cover a remaining portion of the plurality of pixel openings; and the first touch electrode sections and the second touch electrode sections are both rhombus in shape.

Optionally, the touch sensing structure comprises a self capacitance touch sensing structure, wherein the touch connection lines function as signal lines of the self capacitance touch sensing structure.

The plurality of touch electrodes are each a rectangle in shape and the plurality of touch electrodes cover the plurality of pixel openings.

The present invention further provides a manufacturing method of a flexible embedded touch control structure, which comprises the following steps:

Step 1: providing a TFT substrate, forming an organic material film on the TFT substrate, and subjecting the organic material film to patterning treatment to form a planarization layer;

Step 2: forming a first conductive layer on the TFT substrate and the planarization layer through deposition and subjecting the first conductive layer to patterning treatment to form an anode layer, wherein the anode layer comprises a plurality of anode units that are spaced from each other and a plurality of touch connection lines arranged between the plurality of anode units;

Step 3: forming an isolation layer on the planarization layer and the anode layer and subjecting the isolation layer to patterning treatment to form a pixel definition layer, wherein the pixel definition layer defines and surrounds a plurality of pixel openings arranged in an array on the anode layer to respectively correspond to the plurality of anode units and the pixel definition layer is formed with a plurality of vias located above the touch connection lines;

Step 4: forming emissive layers in the pixel openings defined and surrounded by the pixel definition layer on the anode layer;

Step 5: providing a first fine mask and using the first fine mask as a shielding layer to form a patterned cathode layer on the pixel definition layer and the emissive layers through vapor deposition so as to form an OLED touch layer that comprises the anode layer, the pixel definition layer, the emissive layers, and the cathode layer;

wherein the cathode layer comprises a plurality of touch electrodes, and the plurality of touch electrodes are respectively connected through the plurality of vias to the touch connection lines to form a touch sensing structure, wherein the cathode layer covers the plurality of pixel openings and the emissive layer arranged in each of the pixel openings, the one of the anode units located thereunder and corresponding thereto, and the cathode layer located thereabove and corresponding thereto collectively form an OLED unit structure; and Step 6: forming an encapsulation layer on the pixel definition layer and the cathode layer;

wherein the touch sensing structure comprises a bridge capacitive touch sensing structure, wherein the plurality of touch electrodes comprise a plurality of first touch electrode sections arranged in an array, a plurality of second touch electrode sections located between the plurality of first touch electrode sections and arranged in an array, and a plurality of connection sections each electrically connecting two adjacent ones of the first touch electrode sections; and the touch connection lines function as bridges of the bridge capacitive touch sensing structure to each electrically connect two adjacent ones of the second touch electrode sections; and wherein the plurality of touch electrodes cover a portion of the plurality of pixel openings; and the cathode layer further comprises a plurality of auxiliary electrodes located between the plurality of touch electrodes and the plurality of auxiliary electrodes cover a remaining portion of the plurality of pixel openings; and the first touch electrode sections and the second touch electrode sections are both rhombus in shape.

The efficacy of the present invention is that the present invention provides a flexible embedded touch control structure, which comprises a TFT substrate, a planarization layer, an OLED touch layer, and an encapsulation layer. The OLED touch layer comprises an anode layer, a pixel definition layer, emissive layers, and a cathode layer. The anode layer comprises a plurality of anode units and a plurality of touch connection line. The plurality of touch connection lines are located under and correspond to the pixel definition layer. The cathode layer comprises a plurality of touch electrodes, and the plurality of touch electrodes are respectively connected through a plurality of vias formed in the pixel definition layer to the touch connection lines to form a touch sensing structure. The present invention integrates a touch sensor in a flexible panel so as to effectively reduce the number of attaching operations conducted in a panel, reduces an overall thickness of the panel, increases the flexibility of the panel, and thus improve yield, and compared to an existing flexible OLED panel, requires only change of the pattern designs of the cathode layer and the anode layer so that the manufacturing process is simple. The present invention provides a manufacturing method of a flexible embedded touch control structure, which, as compared to a known manufacturing process of a flexible OLED panel, makes touch connection lines in a non-emissive area to serve as touch wiring in patterning an anode layer and changes the formation of a cathode layer that is conventionally formed through vapor deposition on an entire surface to a cathode layer that is formed as being patterned through vapor deposition conducted with a fine mask for making touch electrodes in the cathode layer with the touch electrodes being made engaging with the touch connection lines to form a touch sensing structure, whereby through integration of a touch sensor in a flexible panel, the number of attaching operations conducted in a panel can be reduced; an overall thickness of the panel can be decreased; and the flexibility of the panel can be increased so as to improve yield, and the manufacturing process is simple.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 14:
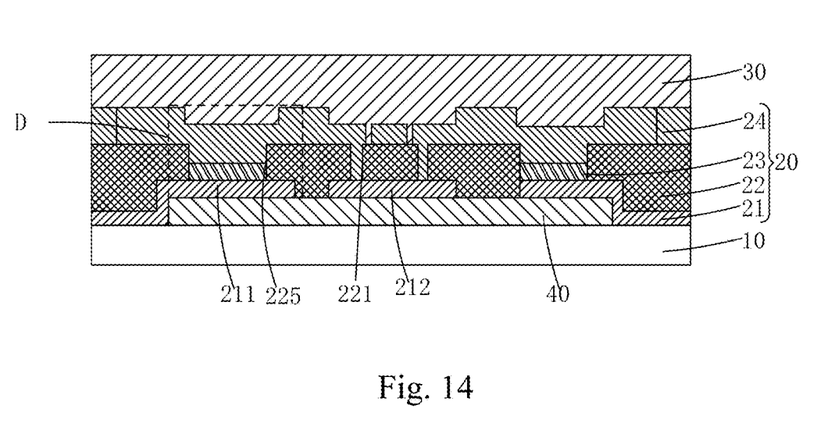
FIG. 14 is a schematic view illustrating Step 6 of the manufacturing method of a flexible embedded touch control structure according to the present invention and is also a schematic view of a flexible embedded touch control structure according to the present invention.

Referring to FIG. 14, the present invention provides a flexible embedded touch control structure, which generally comprises a thin-film transistor (TFT) substrate 10, a planarization layer 40 arranged on the TFT substrate 10, an organic light emitting diode (OLED) touch layer 20 arranged on the TFT substrate 10 and the planarization layer 40, and an encapsulation layer 30 arranged on the OLED touch layer 20. The present invention proposes a technique for integrating a touch sensor in a flexible panel to help reduce the number of attaching operations and improving yield, and also to effectively decrease an overall thickness of a panel and increase flexibility.

Figure 3:
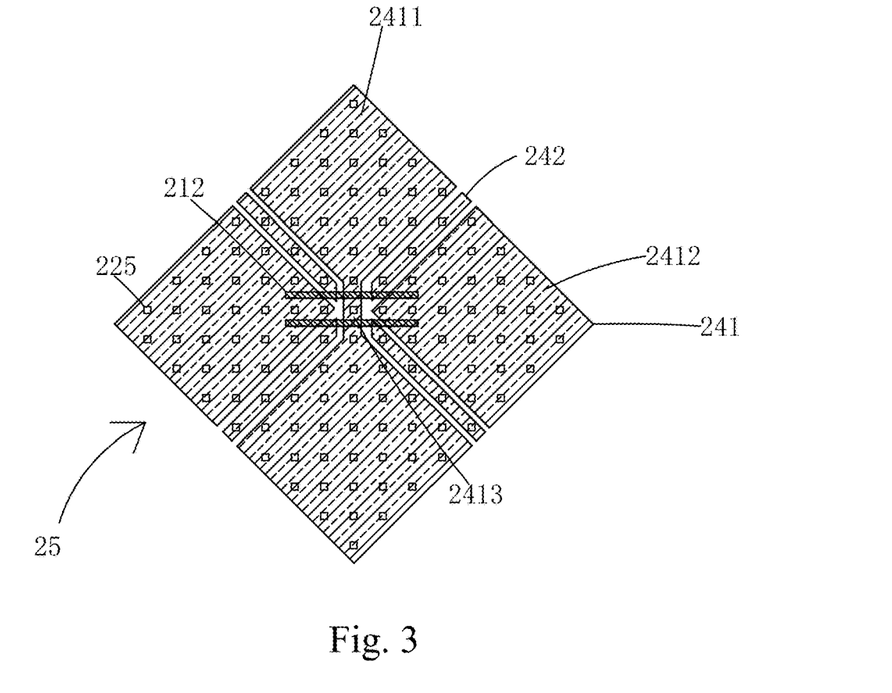
FIG. 3 is a schematic top plan view illustrating a flexible embedded touch control structure according to a first embodiment of the present invention.

Further, referring to FIG. 3, FIG. 3 provides a schematic top plan view showing a first embodiment of the flexible embedded touch control structure according to the present invention, and it is noted that certain structural components, including the TFT substrate 10 and the planarization layer 40, are omitted in FIG. 3 to help clearly illustrate a structure of a touch sensor involved in the instant embodiment. In the instant embodiment, the OLED touch layer 20 comprises: an anode layer 21 arranged on the TFT substrate 10, a pixel definition layer 22 arranged on the planarization layer 40 and the anode layer 21, emissive layers 23 arranged on the anode layer 21, and a cathode layer 24 arranged on the pixel definition layer 22 and the emissive layers 23.

The pixel definition layer 22 defines and surrounds a plurality of pixel openings 225 that are arranged in an array on the anode layer 21. The anode layer 21 comprises a plurality of anode units 211 that are arranged to correspond to the pixel openings 225 respectively and a plurality of touch connection lines 212 located under the pixel definition layer 22 and arranged alternate with the anode units 211. The emissive layers 23 are arranged in the pixel openings 22.

The pixel definition layer 22 is formed with a plurality of vias 221 located above the touch connection line 212. The cathode layer 24 comprises a plurality of touch electrodes 241, and the plurality of touch electrodes 241 are respectively connected through the plurality of vias 221 to the touch connection lines 212 to form a touch sensing structure 25.

The cathode layer 24 covers the plurality of pixel openings 225. The emissive layer 23 arranged in each of the pixel openings 225, the one of the anode units 211 located thereunder and corresponding thereto, and the cathode layer 24 located thereabove and corresponding thereto collectively form an OLED unit structure D.

Further, in the instant embodiment, the touch sensing structure 25 is arranged as a bridge capacitive touch sensing structure, wherein the plurality of touch electrodes 241 comprise a plurality of first touch electrode sections 2411 arranged in an array, a plurality of second touch electrode sections 2412 located between the plurality of first touch electrode sections 2411 and arranged in an array, and a plurality of connection sections 2413 each electrically connecting two adjacent ones of the first touch electrode sections 2411 respectively set at upper and lower sides.

The touch connection lines 212 function as bridges of the bridge capacitive touch sensing structure to each electrically connect two adjacent ones of the second touch electrode sections 2412 respectively set at left and right sides.

Specifically, the plurality of touch electrodes 241 cover a portion of the plurality of pixel openings 225. The cathode layer 24 further comprises a plurality of auxiliary electrodes 242 located between the plurality of touch electrodes 241 and the plurality of auxiliary electrodes 242 cover a remaining portion of the plurality of pixel openings 225. The first touch electrode sections 2411 and the second touch electrode sections 2412 are both rhombus in shape.

Specifically, the anode units 211 extend through the planarization layer 40 to get connected with the TFT substrate 10.

Specifically, the emissive layer 23 comprises, formed in sequence from bottom to top, a hole injection layer, a hole transportation layer, an organic emissive layer, an electron transportation layer, and an electron injection layer.

Figure 4:
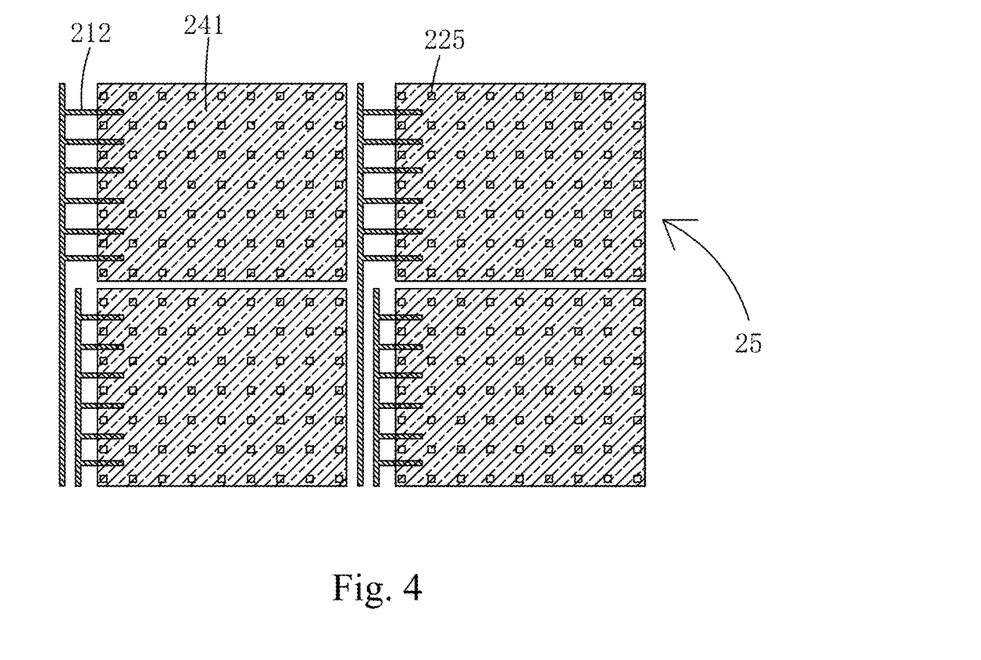
FIG. 4 is a schematic top plan view illustrating a flexible embedded touch control structure according to a second embodiment of the present invention.

Referring to FIG. 4, FIG. 4 provides a schematic top plan view showing a second embodiment of the flexible embedded touch control structure according to the present invention and FIG. 4 similarly omits certain structural components including the TFT substrate 10 and the planarization layer 40 to help clearly illustrate the touch sensing structure 25 of the instant embodiment. Compared to the first embodiment described above, the touch sensing structure 25 of the instant embodiment is arranged as a self capacitance touch sensing structure, wherein the touch connection lines 212 function as signal lines of the self capacitance touch sensing structure.

Specifically, the plurality of touch electrodes 241 are each a rectangle in shape and the plurality of touch electrodes 241 cover the plurality of pixel openings 225.

The present invention provides a flexible embedded touch control structure, in which a touch sensor is integrated in a flexible panel so as to help reduce the number of attaching operations conducted in the panel, effectively decrease an overall thickness of the panel, and increase flexibility of the panel to thereby improve yield. Compared to a conventional flexible OLED panel, it only needs to change the pattern designs of the cathode layer 24 and the anode layer 21 such that touch connection lines 212 are formed in a non-emissive area of the anode layer 21 and touch electrodes 241 are formed in the cathode layer 24, wherein the patterns of the touch electrodes 241 and the touch connection line 212 are determined according to the type of a touch sensing structure 25 formed in advance, such as a bridge capacitive touch sensor and a self capacitance touch sensor, and the manufacturing process is simple.

Figure 5:
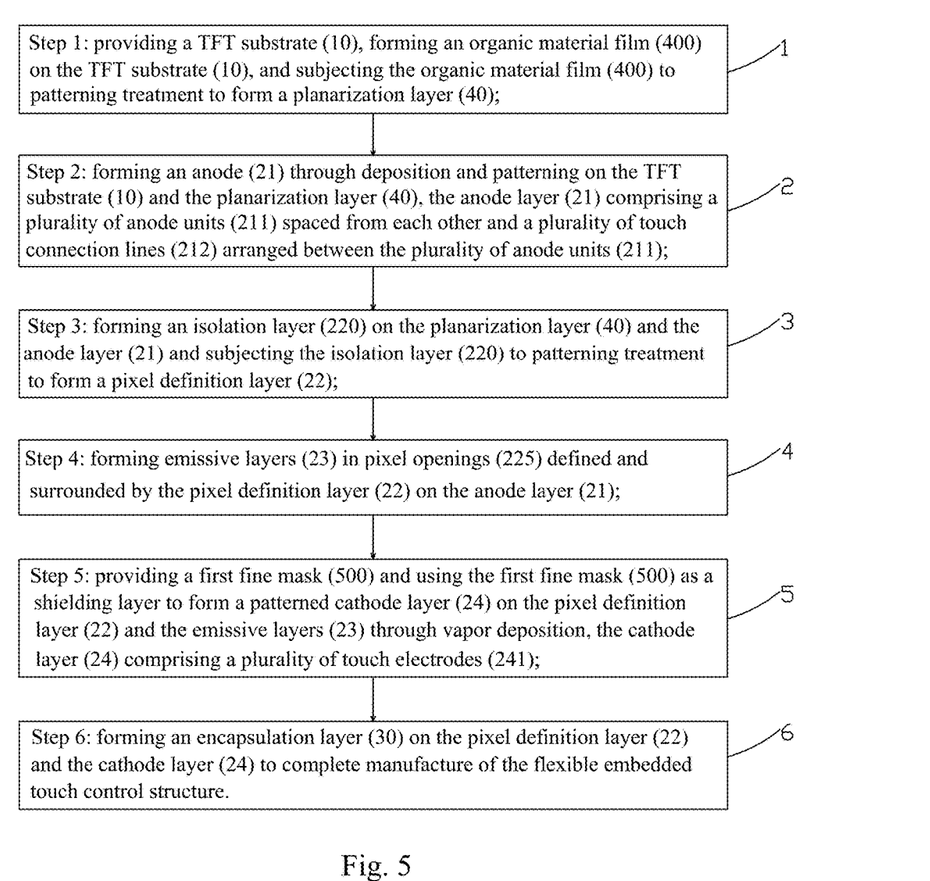
FIG. 5 is a flow chart illustrating a manufacturing method of a flexible embedded touch control structure according to the present invention.
Figure 6:
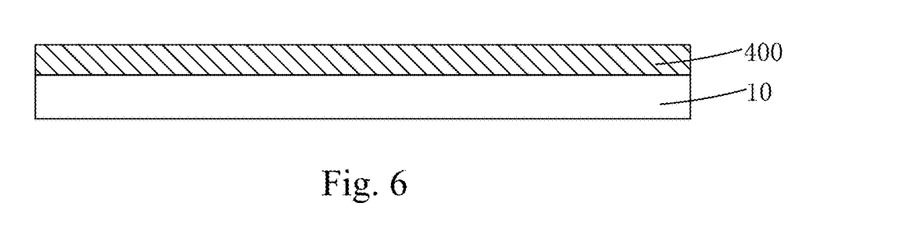
FIGS. 6-7 are schematic views illustrating Step 1 of the manufacturing method of a flexible embedded touch control structure according to the present invention.
Figures 7, 8:
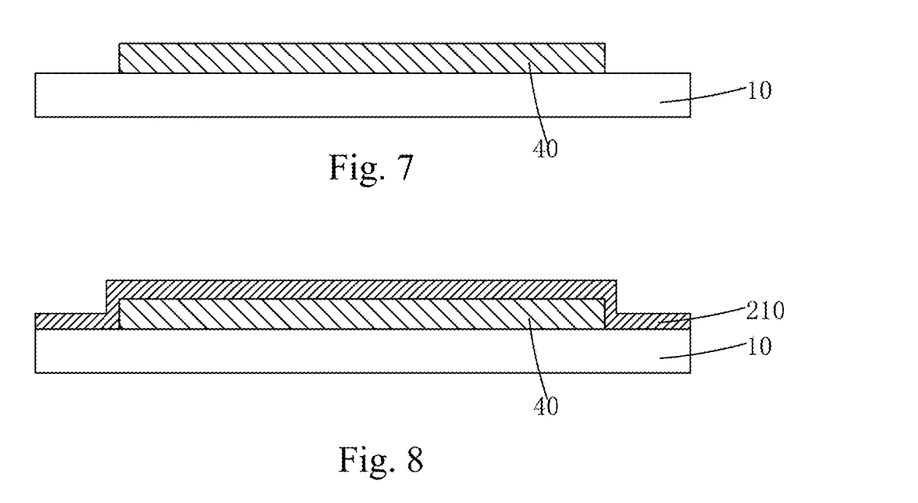
FIGS. 8-9 are schematic views illustrating Step 2 of the manufacturing method of a flexible embedded touch control structure according to the present invention.

Referring to FIG. 5, based on the flexible embedded touch control structure described above, the present invention also provides a manufacturing method of a flexible embedded touch control structure, which comprises the following steps:

Step 1: as shown in FIGS. 6-7, providing a thin-film transistor (TFT) substrate 10, forming an organic material film 400 on the TFT substrate 10, and subjecting the organic material film 400 to patterning treatment to form a planarization layer 40.

Figure 9:
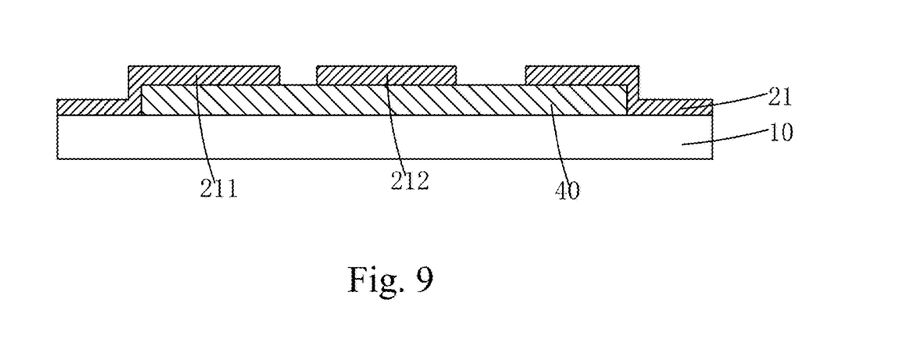

Step 2: as shown in FIGS. 8-9, forming a first conductive layer 210 on the TFT substrate 10 and the planarization layer 40 through deposition and subjecting the first conductive layer 210 to patterning treatment to form an anode layer 21, wherein the anode layer 21 comprises a plurality of anode units 211 that are spaced from each other and a plurality of touch connection lines 212 arranged between the plurality of anode units 211.

Specifically, the anode units 211 extend through the planarization layer 40 to get connected with the TFT substrate 10.

Figure 10:
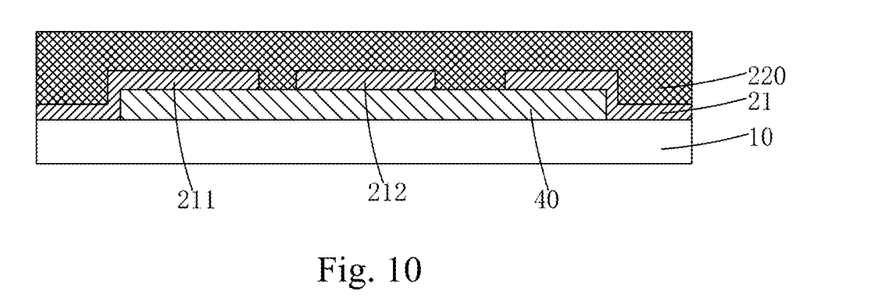
FIG. 10-11 are schematic views illustrating Step 3 of the manufacturing method of a flexible embedded touch control structure according to the present invention.
Figure 11:
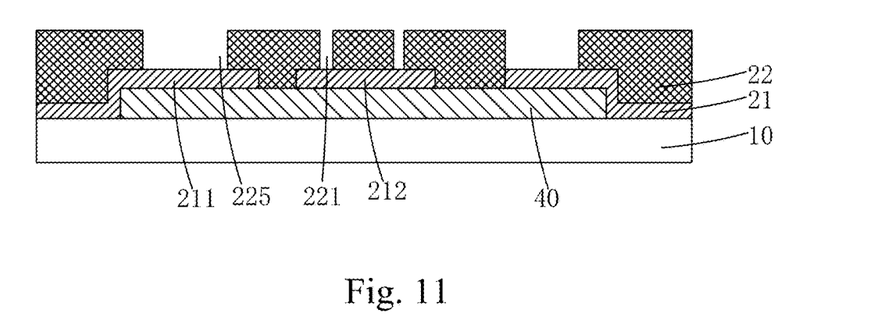

Step 3: as shown in FIGS. 10-11, forming an isolation layer 220 on the planarization layer 40 and the anode layer 21 and subjecting the isolation layer 220 to patterning treatment to form a pixel definition layer 22, wherein the pixel definition layer 22 defines and surrounds a plurality of pixel openings 225 arranged in an array on the anode layer 21 to respectively correspond to the plurality of anode units 211 and the pixel definition layer 22 is formed with a plurality of vias 221 located above the touch connection lines 212.

Figure 12:
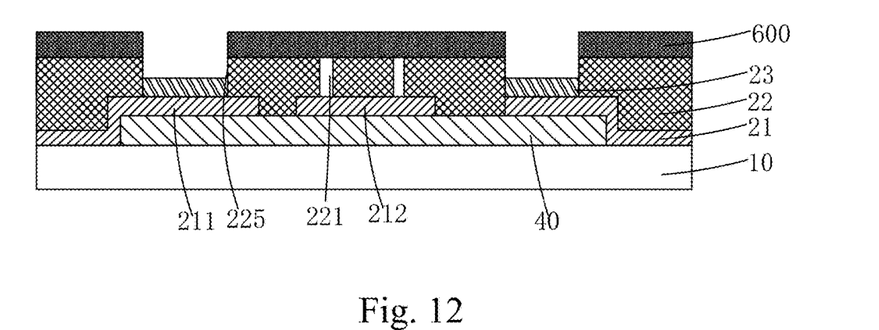
FIG. 12 is a schematic view illustrating Step 4 of the manufacturing method of a flexible embedded touch control structure according to the present invention.

Step 4: as shown in FIG. 12, forming emissive layers 23 in the pixel openings 225 defined and surrounded by the pixel definition layer 22 on the anode layer 21.

Specifically, the emissive layer 23 comprises, formed in sequence from bottom to top, a hole injection layer, a hole transportation layer, an organic emissive layer, an electron transportation layer, and an electron injection layer.

Specifically, in Step 4, a second fine mask 600 is used to form the emissive layers 23 on the anode layer 21.

Figure 13:
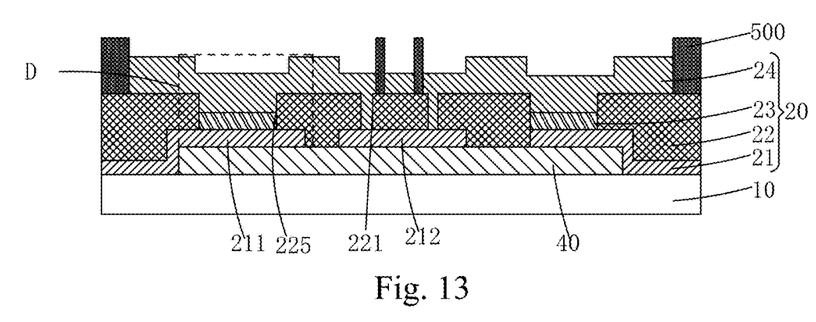
FIG. 13 is a schematic view illustrating Step 5 of the manufacturing method of a flexible embedded touch control structure according to the present invention.

Step 5: as shown in FIG. 13, providing a first fine mask 500 and using the first fine mask 500 as a shielding layer to form a patterned cathode layer 24 on the pixel definition layer 22 and the emissive layers 23 through vapor deposition so as to form an OLED touch layer 20 that comprises the anode layer 21, the pixel definition layer 22, the emissive layers 23, and the cathode layer 24.

Specifically, the cathode layer 24 comprises a plurality of touch electrodes 241, and the plurality of touch electrodes 241 are respectively connected through the plurality of vias 221 to the touch connection lines 212 to form a touch sensing structure 25. The cathode layer 24 covers the plurality of pixel openings 225. The emissive layer 23 arranged in each of the pixel openings 225, the one of the anode units 211 located thereunder and corresponding thereto, and the cathode layer 24 located thereabove and corresponding thereto collectively form an OLED unit structure D.

Step 6: as shown in FIG. 14, forming an encapsulation layer 30 on the pixel definition layer 22 and the cathode layer 24 to complete manufacture of the flexible embedded touch control structure.

Specifically, the touch sensing structure 25 can be a bridge capacitive touch sensing structure, wherein the plurality of touch electrodes 241 comprises a plurality of first touch electrode sections 2411 arranged in an array, a plurality of second touch electrode sections 2412 located between the plurality of first touch electrode sections 2411 and arranged in an array, and a plurality of connection sections 2413 each electrically connecting two adjacent ones of the first touch electrode sections 2411 respectively set at upper and lower sides; and touch connection lines 212 function as bridges of the bridge capacitive touch sensing structure to each electrically connect two adjacent ones of the second touch electrode sections 2412 respectively set at left and right sides. The plurality of touch electrodes 241 cover a portion of the plurality of pixel openings 225; the cathode layer 24 further comprises a plurality of auxiliary electrodes 242 located between the plurality of touch electrodes 241 and the plurality of auxiliary electrodes 242 cover a remaining portion of the plurality of pixel openings 225; and the first touch electrode sections 2411 and the second touch electrode sections 2412 are both rhombus in shape.

Or, alternatively, the touch sensing structure 25 may be arranged as a self capacitance touch sensing structure, and the touch connection lines 212 function as signal lines of the self capacitance touch sensing structure. The plurality of touch electrodes 241 are each a rectangle in shape and the plurality of touch electrodes 241 cover the plurality of pixel openings 225.

The present invention provides a manufacturing method of a flexible embedded touch control structure, which, as compared to a known manufacturing process of a flexible OLED panel, makes touch connection lines 212 in a non-emissive area to serve as touch wiring in patterning an anode layer 21 and changes the formation of a cathode layer that is conventionally formed through vapor deposition on an entire surface to a cathode layer 24 that is formed as being patterned through vapor deposition conducted with a fine mask, wherein in making the cathode layer 24, it only needs to replace a common metal mask (CMM) for vapor deposition with a fine metal mask for making touch electrodes 241 in the cathode layer 24 with the touch electrodes 241 being made engaging with the touch connection lines 212 during the vapor deposition to form the touch sensing structure 25, wherein the patterns of the touch electrodes 241 and the touch connection line 212 are determined according to the type of the touch sensing structure 25 formed in advance, such as a bridge capacitive touch sensor and a self capacitance touch sensor, whereby through integration of the touch sensor in the flexible panel, the number of attaching operations conducted in the panel can be reduced to improve yield; an overall thickness of the panel can be reduced; and flexibility of the panel can be increased, and the manufacturing process is simple.

In summary, the present invention provides a flexible embedded touch control structure, which comprises a TFT substrate, a planarization layer, an OLED touch layer, and an encapsulation layer. The OLED touch layer comprises an anode layer, a pixel definition layer, emissive layers, and a cathode layer. The anode layer comprises a plurality of anode units and a plurality of touch connection line. The plurality of touch connection lines are located under and correspond to the pixel definition layer. The cathode layer comprises a plurality of touch electrodes, and the plurality of touch electrodes are respectively connected through a plurality of vias formed in the pixel definition layer to the touch connection lines to form a touch sensing structure. The present invention integrates a touch sensor in a flexible panel so as to effectively reduce the number of attaching operations conducted in a panel, reduces an overall thickness of the panel, increases the flexibility of the panel, and thus improve yield, and compared to an existing flexible OLED panel, requires only change of the pattern designs of the cathode layer and the anode layer so that the manufacturing process is simple. The present invention provides a manufacturing method of a flexible embedded touch control structure, which, as compared to a known manufacturing process of a flexible OLED panel, makes touch connection lines in a non-emissive area to serve as touch wiring in patterning an anode layer and changes the formation of a cathode layer that is conventionally formed through vapor deposition on an entire surface to a cathode layer that is formed as being patterned through vapor deposition conducted with a fine mask for making touch electrodes in the cathode layer with the touch electrodes being made engaging with the touch connection lines to form a touch sensing structure, whereby through integration of a touch sensor in a flexible panel, the number of attaching operations conducted in a panel can be reduced; an overall thickness of the panel can be decreased; and the flexibility of the panel can be increased so as to improve yield, and the manufacturing process is simple.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A flexible embedded touch control structure, comprising: a thin-film transistor (TFT) substrate, a planarization layer arranged on the TFT substrate, an organic light emitting diode (OLED) touch layer arranged on the TFT substrate and the planarization layer, and an encapsulation layer arranged on the OLED touch layer;

wherein the OLED touch layer comprises: an anode layer arranged on the TFT substrate, a pixel definition layer arranged on the planarization layer and the anode layer, emissive layers arranged on the anode layer, and a cathode layer arranged on the pixel definition layer and the emissive layers;

the pixel definition layer defines and surrounds a plurality of pixel openings that are arranged in an array on the anode layer; the anode layer comprises a plurality of anode units that are arranged to correspond to the pixel openings respectively and a plurality of touch connection lines located under the pixel definition layer and arranged alternate with the anode units; and the emissive layers are arranged in the pixel openings;

the pixel definition layer is formed with a plurality of vias located above the touch connection line; and the cathode layer comprises a plurality of touch electrodes, and the plurality of touch electrodes are respectively connected through the plurality of vias to the touch connection lines to form a touch sensing structure; and the cathode layer covers the plurality of pixel openings and the emissive layer arranged in each of the pixel openings, the one of the anode units located thereunder and corresponding thereto, and the cathode layer located thereabove and corresponding thereto collectively form an OLED unit structure.

2. The flexible embedded touch control structure as claimed in claim 1, wherein the touch sensing structure comprises a bridge capacitive touch sensing structure, wherein the plurality of touch electrodes comprise a plurality of first touch electrode sections arranged in an array, a plurality of second touch electrode sections located between the plurality of first touch electrode sections and arranged in an array, and a plurality of connection sections each electrically connecting two adjacent ones of the first touch electrode sections; and the touch connection lines function as bridges of the bridge capacitive touch sensing structure to each electrically connect two adjacent ones of the second touch electrode sections.

3. The flexible embedded touch control structure as claimed in claim 1, wherein the touch sensing structure comprises a self capacitance touch sensing structure, wherein the touch connection lines function as signal lines of the self capacitance touch sensing structure.

4. The flexible embedded touch control structure as claimed in claim 2, wherein the plurality of touch electrodes cover a portion of the plurality of pixel openings; and the cathode layer further comprises a plurality of auxiliary electrodes located between the plurality of touch electrodes and the plurality of auxiliary electrodes cover a remaining portion of the plurality of pixel openings; and the first touch electrode sections and the second touch electrode sections are both rhombus in shape.

5. The flexible embedded touch control structure as claimed in claim 3, wherein the plurality of touch electrodes are each a rectangle in shape and the plurality of touch electrodes cover the plurality of pixel openings.

6. A manufacturing method of a flexible embedded touch control structure, comprising the following steps:

Step 1: providing a thin-film transistor (TFT) substrate, forming an organic material film on the TFT substrate, and subjecting the organic material film to patterning treatment to form a planarization layer;

Step 2: forming a first conductive layer on the TFT substrate and the planarization layer through deposition and subjecting the first conductive layer to patterning treatment to form an anode layer, wherein the anode layer comprises a plurality of anode units that are spaced from each other and a plurality of touch connection lines arranged between the plurality of anode units;

Step 3: forming an isolation layer on the planarization layer and the anode layer and subjecting the isolation layer to patterning treatment to form a pixel definition layer, wherein the pixel definition layer defines and surrounds a plurality of pixel openings arranged in an array on the anode layer to respectively correspond to the plurality of anode units and the pixel definition layer is formed with a plurality of vias located above the touch connection lines;

Step 4: forming emissive layers in the pixel openings defined and surrounded by the pixel definition layer on the anode layer;

Step 5: providing a first fine mask and using the first fine mask as a shielding layer to form a patterned cathode layer on the pixel definition layer and the emissive layers through vapor deposition so as to form an organic light emitting diode (OLED) touch layer that comprises the anode layer, the pixel definition layer, the emissive layers, and the cathode layer;

wherein the cathode layer comprises a plurality of touch electrodes, and the plurality of touch electrodes are respectively connected through the plurality of vias to the touch connection lines to form a touch sensing structure, wherein the cathode layer covers the plurality of pixel openings and the emissive layer arranged in each of the pixel openings, the one of the anode units located thereunder and corresponding thereto, and the cathode layer located thereabove and corresponding thereto collectively form an OLED unit structure; and Step 6: forming an encapsulation layer on the pixel definition layer and the cathode layer.

7. The manufacturing method of a flexible embedded touch control structure as claimed in claim 6, wherein the touch sensing structure comprises a bridge capacitive touch sensing structure, wherein the plurality of touch electrodes comprise a plurality of first touch electrode sections arranged in an array, a plurality of second touch electrode sections located between the plurality of first touch electrode sections and arranged in an array, and a plurality of connection sections each electrically connecting two adjacent ones of the first touch electrode sections; and the touch connection lines function as bridges of the bridge capacitive touch sensing structure to each electrically connect two adjacent ones of the second touch electrode sections.

8. The manufacturing method of a flexible embedded touch control structure as claimed in claim 6, wherein the touch sensing structure comprises a self capacitance touch sensing structure, wherein the touch connection lines function as signal lines of the self capacitance touch sensing structure.

9. The manufacturing method of a flexible embedded touch control structure as claimed in claim 7, wherein the plurality of touch electrodes cover a portion of the plurality of pixel openings; and the cathode layer further comprises a plurality of auxiliary electrodes located between the plurality of touch electrodes and the plurality of auxiliary electrodes cover a remaining portion of the plurality of pixel openings; and the first touch electrode sections and the second touch electrode sections are both rhombus in shape.

10. The manufacturing method of a flexible embedded touch control structure as claimed in claim 8, wherein the plurality of touch electrodes are each a rectangle in shape and the plurality of touch electrodes cover the plurality of pixel openings.

11. A manufacturing method of a flexible embedded touch control structure, comprising the following steps:

Step 1: providing a thin-film transistor (TFT) substrate, forming an organic material film on the TFT substrate, and subjecting the organic material film to patterning treatment to form a planarization layer;

Step 2: forming a first conductive layer on the TFT substrate and the planarization layer through deposition and subjecting the first conductive layer to patterning treatment to form an anode layer, wherein the anode layer comprises a plurality of anode units that are spaced from each other and a plurality of touch connection lines arranged between the plurality of anode units;

Step 3: forming an isolation layer on the planarization layer and the anode layer and subjecting the isolation layer to patterning treatment to form a pixel definition layer, wherein the pixel definition layer defines and surrounds a plurality of pixel openings arranged in an array on the anode layer to respectively correspond to the plurality of anode units and the pixel definition layer is formed with a plurality of vias located above the touch connection lines;

Step 4: forming emissive layers in the pixel openings defined and surrounded by the pixel definition layer on the anode layer;

Step 5: providing a first fine mask and using the first fine mask as a shielding layer to form a patterned cathode layer on the pixel definition layer and the emissive layers through vapor deposition so as to form an organic light emitting diode (OLED) touch layer that comprises the anode layer, the pixel definition layer, the emissive layers, and the cathode layer;

wherein the cathode layer comprises a plurality of touch electrodes, and the plurality of touch electrodes are respectively connected through the plurality of vias to the touch connection lines to form a touch sensing structure, wherein the cathode layer covers the plurality of pixel openings and the emissive layer arranged in each of the pixel openings, the one of the anode units located thereunder and corresponding thereto, and the cathode layer located thereabove and corresponding thereto collectively form an OLED unit structure; and Step 6: forming an encapsulation layer on the pixel definition layer and the cathode layer;

wherein the touch sensing structure comprises a bridge capacitive touch sensing structure, wherein the plurality of touch electrodes comprise a plurality of first touch electrode sections arranged in an array, a plurality of second touch electrode sections located between the plurality of first touch electrode sections and arranged in an array, and a plurality of connection sections each electrically connecting two adjacent ones of the first touch electrode sections; and the touch connection lines function as bridges of the bridge capacitive touch sensing structure to each electrically connect two adjacent ones of the second touch electrode sections; and wherein the plurality of touch electrodes cover a portion of the plurality of pixel openings; and the cathode layer further comprises a plurality of auxiliary electrodes located between the plurality of touch electrodes and the plurality of auxiliary electrodes cover a remaining portion of the plurality of pixel openings; and the first touch electrode sections and the second touch electrode sections are both rhombus in shape.

* * * * *